(12) United States Patent
Qian et al.

(10) Patent No.: US 11,300,627 B2
(45) Date of Patent: Apr. 12, 2022

(54) METHOD FOR DETERMINING BATTERY STATE OF LITHIUM ION SECONDARY BATTERY

(71) Applicant: HONDA MOTOR CO., LTD., Tokyo (JP)

(72) Inventors: Pu Qian, Saitama (JP); Hiroshi Sakai, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/889,821

(22) Filed: Jun. 2, 2020

(65) Prior Publication Data
US 2020/0386825 A1 Dec. 10, 2020

(30) Foreign Application Priority Data
Jun. 7, 2019 (JP) .............................. JP2019-107092

(51) Int. Cl.
*G01R 31/392* (2019.01)
*G01R 31/3842* (2019.01)
(Continued)

(52) U.S. Cl.
CPC ....... *G01R 31/392* (2019.01); *G01R 31/3842* (2019.01); *H01M 10/0525* (2013.01); *H01M 10/48* (2013.01)

(58) Field of Classification Search
CPC .............. G01R 31/392; G01R 31/3842; G01R 31/3835; G01R 31/389; H01M 10/48;
(Continued)

(56) References Cited

U.S. PATENT DOCUMENTS

| 2017/0104347 | A1* | 4/2017 | Shimonishi | ............. | H02J 7/007 |
| 2018/0226636 | A1* | 8/2018 | Sawa | ...................... | H01M 4/32 |
| 2019/0178952 | A1* | 6/2019 | Takahashi | .......... | G01R 31/3842 |

FOREIGN PATENT DOCUMENTS

| JP | 2009080093 A | * | 4/2009 | ............. | Y02E 60/10 |
| JP | 2017111860 A | * | 6/2017 | ............. | G01R 31/36 |

(Continued)

*Primary Examiner* — Tarun Sinha
*Assistant Examiner* — Lal C Mang
(74) *Attorney, Agent, or Firm* — CKC & Partners Co., LLC

(57) ABSTRACT

Provided is a method for determining a battery state of a lithium ion secondary battery that allows for understand a deterioration state of the battery without performing full charging of the battery.

To estimate an entire image of a charge-discharge curve on the basis of a fragmentary charge-discharge curve by analyzing a relaxation process after the electric current interruption to grasp the resistance of a battery and taking into consideration a resulting resistance value.

Specifically, a method for determining a battery state of a lithium ion secondary battery includes: a partial charge-discharge curve calculating step of acquiring, by partial charge or partial discharge, a partial charge-discharge curve which is a part of a charge-discharge curve, and calculating a positive electrode partial charge-discharge curve and a negative electrode partial charge-discharge curve; a resistance grasping step of grasping a resistance value of the lithium ion secondary battery on a basis of a relaxation process of a terminal voltage after interrupting a charging current during charging or a discharge current during discharging; and a charge-discharge curve calculating step of taking into consideration the resistance value thus acquired, and acquiring a calculation charge-discharge curve prepared by calculating an entire image on a basis of the partial charge-discharge curve.

5 Claims, 2 Drawing Sheets

(51) Int. Cl.
*H01M 10/48* (2006.01)
*H01M 10/0525* (2010.01)

(58) Field of Classification Search
CPC ........... H01M 10/0525; H01M 10/425; H01M 2010/4278; Y02E 60/10
See application file for complete search history.

(56) References Cited

FOREIGN PATENT DOCUMENTS

| | | |
|---|---|---|
| JP | 2017111860 A | 6/2017 |
| JP | 2018155706 A | 10/2018 |

\* cited by examiner

METHOD FOR DETERMINING BATTERY STATE OF LITHIUM ION SECONDARY BATTERY

This application is based on and claims the benefit of priority from Japanese Patent Application No. 2019-107092, filed on 7 Jun. 2019, the content of which is incorporated herein by reference.

BACKGROUND OF THE INVENTION

Field of the Invention

The present invention relates to a method for determining a battery state of a lithium ion secondary battery.

More specifically, the present invention relates to a method for determining a battery state of a lithium ion secondary battery that allows for understanding a deterioration state of the battery without performing full charging of the battery.

Related Art

Conventionally, lithium ion secondary batteries are widely used as secondary batteries with high energy density.

in this regard, deterioration in the lithium ion secondary battery occurs by repeating charging and discharging, and its performance decreases as the capacity decreases.

Therefore, it has been studied to suppress a decrease in the performance of the battery or to suppress further deterioration, by grasping the deterioration state of the lithium ion secondary battery.

In particular, in an electric vehicle, it is important to grasp the deterioration state of the lithium ion secondary battery when calculating the travelable distance, the input-output control of the power, etc.

Conventionally, as a method of grasping the deterioration state of a lithium ion secondary battery, a method of preparing a map of the deterioration condition in advance, recording the battery usage history and applying it to the map (refer to Japanese Unexamined Patent Application, Publication No. 2018-155706), and a method of estimating the state by actually measuring the capacity, resistance, impedance, and the like of the battery (refer to Japanese Unexamined Patent Application, Publication No. 2017-111860) have been proposed.

Patent Document 1: Japanese Unexamined Patent Application, Publication No. 2018-155706
Patent Document 2: Japanese Unexamined Patent Application, Publication No. 2017-111860

SUMMARY OF THE INVENTION

However, in the method of preparing a map described in Japanese Unexamined Patent Application, Publication No. 2018-155706, since a great number of batteries are required for preparing the map, labor and time (for example, two years) are also required.

Furthermore, according to the method of using the actual measurement value described in Japanese Unexamined Patent Application, Publication No. 2017-111860, the condition of the battery can be obtained on the basis of the actual measurement value of the full charge and discharge. However, for a battery having no chance of full charge and discharge, it is difficult to obtain the accurate data.

For example, batteries for HEVs are used at around SOC=50% in principle, and batteries for EVs have no chance of full charge and discharge in the use environment, because complete discharge of SOC=0% is not performed.

Therefore, according to the method described in Japanese Unexamined Patent Application, Publication No. 2018-155706 or Japanese Unexamined Patent Application, Publication No. 2017-111860, the apparent performance can be grasped. However, the deterioration of the battery in the actual use condition cannot be grasped.

In addition, it is difficult to predict future deterioration because the deterioration in the actual use environment cannot be grasped.

The present invention has been made in view of the above-mentioned background art, and an object thereof is to provide a method for determining a battery state of a lithium ion secondary battery that allows grasping of a deterioration state of the battery without performing full charging of the battery.

The inventors have intensively investigated a method of estimating the entire image of the charge-discharge curve from the fragmentary charge-discharge curve.

Then, in order to estimate the entire image from the fragmentary charge-discharge curve, the inventors have found that it is possible to solve the above problems, by focusing on the need to consider the resistance, and by, as a method of grasping the resistance, analyzing the relaxation process after the electric current interruption and taking into consideration the resulting resistance value to estimate the entire image of the charge-discharge curve, thereby leading to the completion of the present invention.

According to an aspect of the present invention, a method for determining a battery state of a lithium ion secondary battery is provided which includes: a charge-discharge curve acquiring step of acquiring a positive electrode charge-discharge curve and a negative electrode charge-discharge curve; a partial charge-discharge curve calculating step of acquiring, by partial charge or partial discharge, a partial charge-discharge curve which is a part of a charge-discharge curve, and calculating a positive electrode partial charge-discharge curve and a negative electrode partial charge-discharge curve; a resistance grasping step of grasping a resistance value of the lithium ion secondary battery on a basis of a relaxation process of a terminal voltage after interrupting a charging current during charging or a discharge current during discharging; a charge-discharge curve calculating step of taking into consideration the resistance value, and acquiring a positive electrode calculation charge-discharge curve prepared by calculating an entire image on a basis of the positive electrode partial charge-discharge curve, and a negative electrode calculation charge-discharge curve prepared by calculating an entire image on a basis of the negative electrode partial charge-discharge curve; and a battery state grasping step of calculating a capacity of the lithium ion secondary battery on a basis of the positive electrode calculation charge-discharge curve and the negative electrode calculation charge-discharge curve, and determining or predicting a state of the lithium ion secondary battery.

Furthermore, the method for determining a battery state of a lithium ion secondary battery described above may further include a deterioration control step of applying a control unit for suppressing future deterioration on a basis of a state of deterioration determined in the battery state grasping step.

According to the method for determining the battery state of the lithium ion secondary battery of the present invention, since it is possible to grasp the deterioration state of the battery even without performing full charge and discharge, it is possible to grasp the battery state in a simple manner without requiring a large amount of labor and time.

Furthermore, future deterioration can be predicted on the basis of the determination of the battery state, and moreover, control for suppressing future deterioration can be implemented.

DETAILED DESCRIPTION OF THE INVENTION

Figure 1:
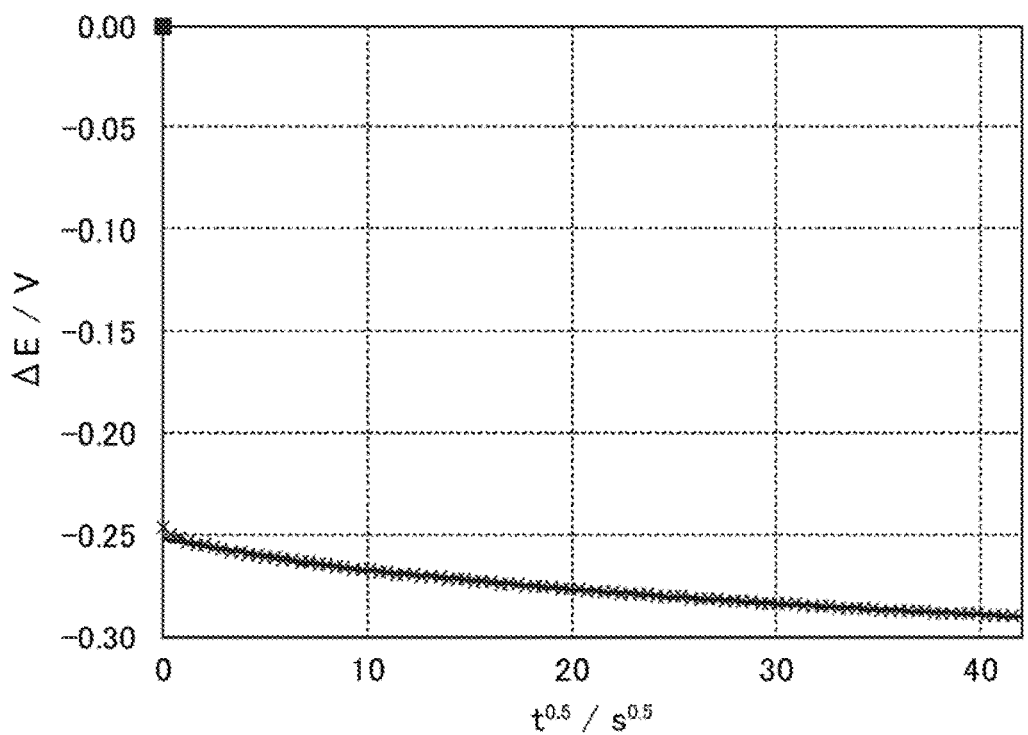
FIG. 1 is a graph showing relaxation behavior after current interruption.

Hereinafter, embodiments of the present invention will be described.

<Method for Determining Battery State of Lithium Ion Secondary Battery>

A method for determining a battery state of a lithium ion secondary battery of the present invention includes: a charge-discharge curve acquiring step; a partial charge-discharge curve calculating step; a resistance grasping step; a charge-discharge curve calculating step; and a battery state grasping step.

It suffices if the method for determining the battery state of the lithium ion secondary battery of the present invention includes these steps as essential steps, and may optionally include other steps.

(Charge-Discharge Curve Acquiring Step)

In the charge-discharge curve acquiring step, a positive electrode charge-discharge curve and a negative electrode charge-discharge curve are acquired.

In the method for determining the battery state of the lithium ion secondary battery of the present invention, the charge-discharge curves of the positive electrode and the negative electrode are acquired in advance.

The method for acquiring the positive electrode charge-discharge curve and the negative electrode charge-discharge curve is not particularly limited, and a method which is usually implemented can be applied.

The positive electrode charge-discharge curve and the negative electrode charge-discharge curve acquired in the charge-discharge curve acquiring step serve as references for determining the state of deterioration of the lithium ion secondary battery and for performing future deterioration prediction.

In the present invention, the determination and the prediction are implemented by using linear curve-fitting based on J. Newman's models.

(Partial Charge-Discharge Curve Calculating Step)

In the partial charge-discharge curve calculating step, by partial charge or partial discharge of the full cell, a partial charge-discharge curve which is a part of the charge-discharge curve of the full cell is acquired, and a positive electrode partial charge-discharge curve and a negative electrode partial charge-discharge curve are calculated.

The method for determining the battery state of the lithium ion secondary battery of the present invention is characterized in that it is unnecessary to perform full charge and discharge of a battery desired to be determined, and it suffices if only partial charge or discharge is performed. The method of acquiring the positive electrode partial charge-discharge curve and the negative electrode partial charge-discharge curve is not particularly limited, and any method which is usually performed for acquiring the charge-discharge curve can be applied.

The lengths of the partial charge-discharge curves of the positive electrode and the negative electrode calculated in the partial charge-discharge curve calculating step are not particularly limited; however, the lengths are preferably $1/10$ to $2/3$ of the total capacity.

If the length is equal to or greater than $1/10$ of the total capacity, adequate accuracy can be guaranteed with the linear curve-fitting based on J. Newman's models.

On the other hand, if the length exceeds $2/3$ of the total capacity, the fitting accuracy can be ensured while the effect of time reduction is reduced.

(Resistance Grasping Step)

In the resistance grasping step, the resistance value of the lithium ion secondary battery is grasped on the basis of the relaxation process of the terminal voltage after interrupting the charging current during charging or the discharge current during discharging.

The method for determining the battery state of the lithium ion secondary battery of the present invention is characterized by taking into consideration the resistance value acquired in the resistance grasping step upon estimating the entire image of the positive electrode charge-discharge curve and the entire image of the negative electrode charge-discharge curve on the basis of the positive electrode partial charge-discharge curve and the negative electrode partial charge-discharge curve, which are fragmentary charge-discharge curves.

With such a configuration, it is possible to accurately grasp the deterioration state corresponding to the usage history.

Furthermore, in the method for determining the battery state of the lithium ion secondary battery of the present invention, it is unnecessary to actually measure the capacity, the resistance, the impedance or the like, of the battery in order to grasp the resistance value of the lithium ion secondary battery from the relaxation process after the interruption of the current.

The methods of grasping the resistance value of the lithium ion secondary battery from the relaxation process after the interruption of the charging current during charging or the discharge current during discharging include, for example, a method of analyzing the relaxation process after the interruption of the current.

The methods of analyzing include, for example, a method of decomposing the relaxation process after the interruption of the current into a plurality of components using a time constant.

The methods of decomposing include, for example, a method of separating the relaxation components and performing fitting according to a diffusion equation.

In the resistance grasping step, it is possible to grasp the resistance value of the lithium ion secondary battery by taking into consideration the time constant and the voltage change of each component by using the acquired decomposition relaxation component.

Hereinafter, the resistance grasping step according to an embodiment of the present invention will be described with reference to the drawings.

FIG. 1 is a graph showing the relaxation behavior of the terminal voltage after the charging current interruption. The vertical axis ΔE/V indicates the amount of change in the terminal voltage, and the horizontal axis t0.5/s0.5 indicates the square root of the elapsed time.

In the graph shown in FIG. 1, in a case in which the current is interrupted during charging, the terminal voltage of the battery drops instantaneously by approximately −0.25 V. Thereafter, it is shown that a gradual relaxation has occurred.

In the resistance grasping step according to an embodiment of the present invention, the relaxation behavior shown in FIG. 1 is decomposed into relaxation components by three time constants.

Figure 2A:
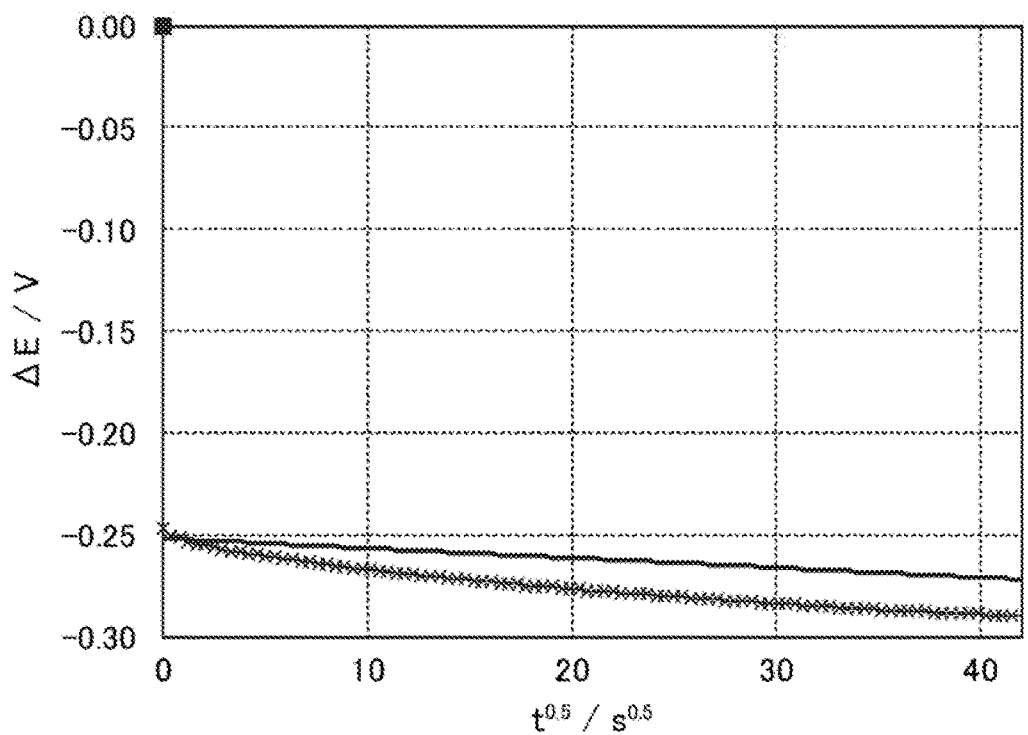
FIG. 2A is a graph showing behavior of a first decomposition relaxation component in the relaxation behavior of FIG. 1.

FIG. 2A is a graph showing the behavior of the first decomposition relaxation component acquired by decomposing the relaxation behavior of FIG. 1 by the first time constant.

Figure 2B:
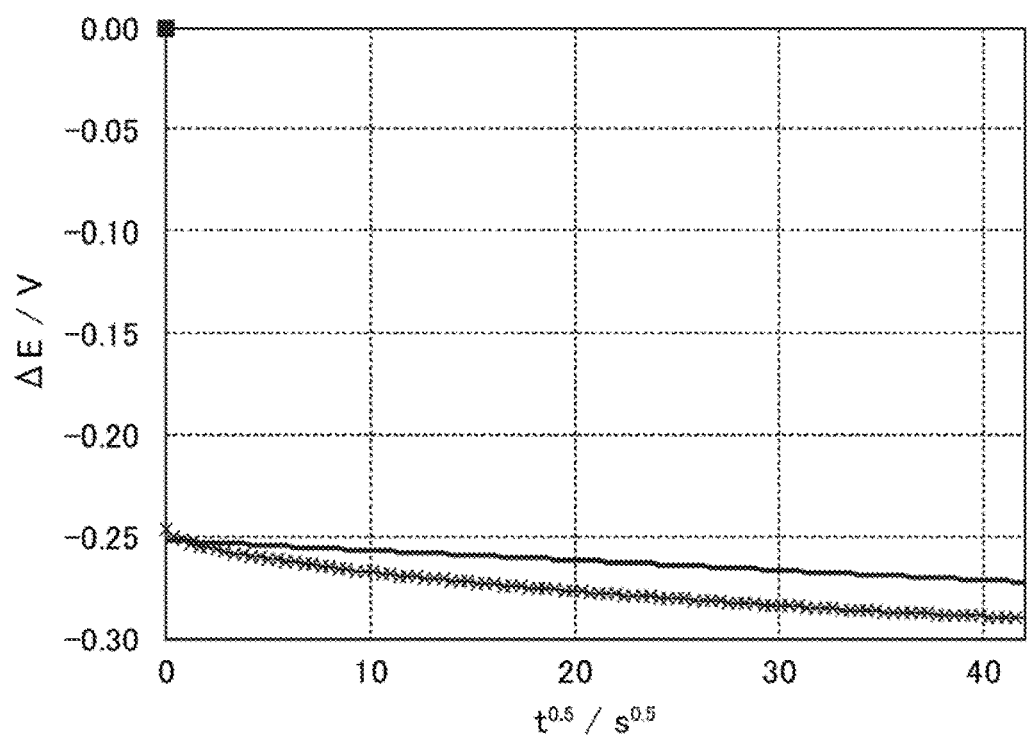
FIG. 2B is a graph showing behavior of a second decomposition relaxation component in the relaxation behavior of FIG. 1.
Figure 2C:
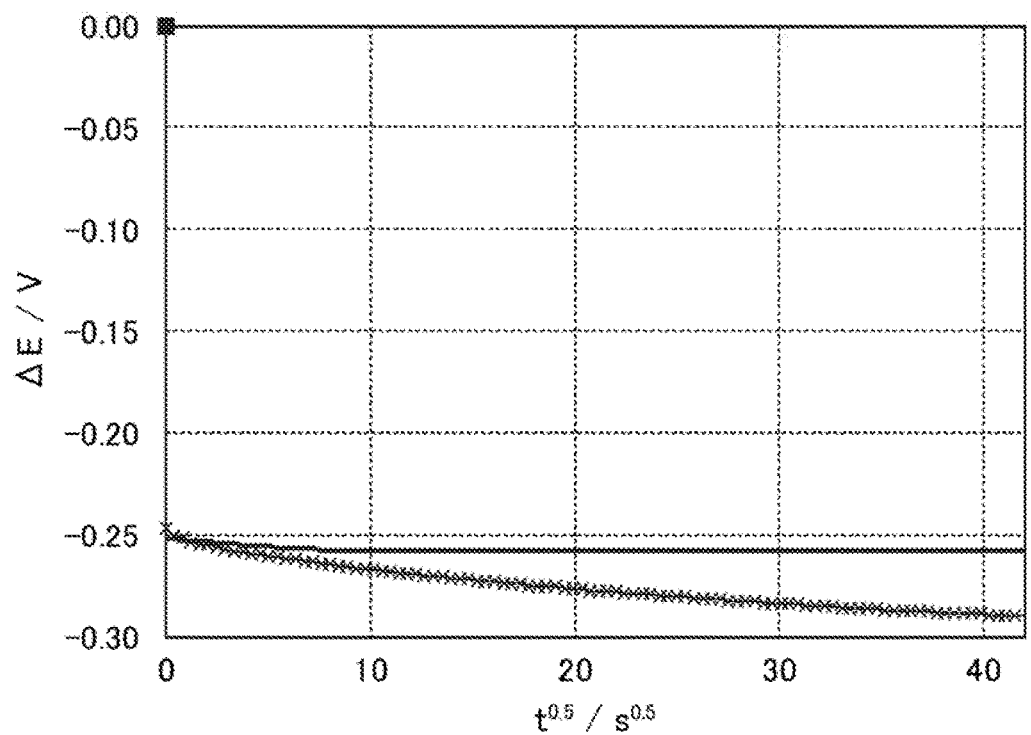
FIG. 2C is a graph showing behavior of a third decomposition relaxation component in the relaxation behavior of FIG. 1.

FIG. 2B is a graph showing the behavior of the second decomposition relaxation component decomposed by the second time constant, and FIG. 2C is a graph showing the behavior of the third decomposition relaxation component decomposed by the third time constant.

In FIGS. 2A to 2C, the curves marked with crosses are the same as the curve shown in FIG. 1 which is the actual measurement value, and the solid lines are the respective decomposition relaxation components decomposed by the time constants.

The resistance grasping step according to one embodiment of the present invention is an example in which the resistance grasping step is decomposed into the relaxation components by three time constants as shown in FIGS. 2A to 2C; however, the number of components decomposing the relaxation behaviors in the resistance grasping step of the present invention is not limited and can be arbitrarily set.

Furthermore, the decomposition is not limited to the decomposition by the time constants, and for example, the decomposition can be performed by the relaxation time.

The method for determining the battery state of the lithium ion secondary battery of the present invention includes calculating the positive electrode partial charge-discharge curve and the negative electrode partial charge-discharge curve from the partial charge-discharge curve of the full cell acquired in the above-described partial charge-discharge curve calculating step and determining to which portions of the positive electrode charge-discharge curve and the negative electrode charge-discharge curve acquired in the charge-discharge curve acquiring step the respective positive electrode partial charge-discharge curve and the negative electrode charge-discharge curve correspond by using the linear curve fitting based on the J. Newman's models, on the basis of the respective decomposition relaxation components acquired in the resistance grasping step.

(Charge-Discharge Curve Calculating Step)

The charge-discharge curve calculating step includes taking into consideration the resistance value acquired in the resistance grasping step described above, and acquiring the positive electrode calculation charge-discharge curve prepared by calculating the entire image of the charge-discharge curve on the basis of the positive electrode partial charge-discharge curve calculated in the partial charge-discharge curve calculating step, and the negative electrode calculation charge-discharge curve prepared by calculating the entire image of the charge-discharge curve on the basis of the negative electrode partial charge-discharge curve calculated in the partial charge-discharge curve calculating step.

Specifically, as described above, the charge-discharge curve calculating step includes determining to which portions of the positive electrode charge-discharge curve and the negative electrode charge-discharge curve acquired in the charge-discharge curve acquiring step the respective positive electrode partial charge-discharge curve and the negative electrode charge-discharge curve calculated in the partial charge-discharge curve calculating step correspond by using the linear curve fitting based on the J. Newman's models, and, by using the determination, calculating the entire image of the charge-discharge curve to acquire the positive electrode calculation charge-discharge curve and the negative electrode calculation charge-discharge curve.

The calculation of the entire image of the charge-discharge curve can be performed, for example, by fitting using the least squares method.

(Battery State Grasping Step)

The battery state grasping step includes calculating the capacity of the lithium ion secondary battery on the basis of the positive electrode calculation charge-discharge curve and the negative electrode calculation charge-discharge curve acquired in the above charge-discharge curve calculating step, and determining or predicting the state of the lithium ion secondary battery.

The method of calculating the capacity of the lithium ion secondary battery is not particularly limited, and can be calculated by a normal method.

As described above, according to the method for determining the battery state of the lithium ion secondary battery of the present invention, it is possible to grasp the deterioration state of the battery without performing full charging of the battery.

(Other Steps)

The method for determining the battery state of the lithium ion secondary battery of the present invention may include any step other than the above-mentioned essential steps, namely, the charge-discharge curve acquiring step, the partial charge-discharge curve calculating step, the resistance grasping step, the charge-discharge curve calculating step, and the battery state grasping step.

(Deterioration Control Step)

Examples of an optional step include a deterioration control step.

In the deterioration control step, a control means for suppressing future deterioration is applied on the basis of the state of deterioration determined in the battery state grasping step.

Since the method for determining the battery state of the lithium ion secondary battery of the present invention can predict future deterioration on the basis of the determination of the battery state, it is possible to perform control for suppressing future deterioration.

The control method performed in the deterioration control step is not particularly limited, and examples thereof include a method of changing the charge-discharge speed or the charge-discharge end voltage.

What is claimed is:

1. A method for determining a battery state of a lithium ion secondary battery, the method comprising:
   a charge-discharge curve acquiring step of acquiring a positive electrode charge-discharge curve and a negative electrode charge-discharge curve;
   a partial charge-discharge curve calculating step of acquiring, by partial charge or partial discharge, a partial charge-discharge curve which is a part of a charge-discharge curve, and calculating a positive electrode partial charge-discharge curve and a negative electrode partial charge-discharge curve;

a resistance grasping step of grasping a resistance value of the lithium ion secondary battery by dividing a relaxation process of a terminal voltage after interrupting a charging current during charging or a discharge current during discharging into a plurality of components using a time constant to obtain a decomposition relaxation components;

a charge-discharge curve calculating step of taking into consideration the resistance value using linear curve fitting based on J. Newman's model on the basis of the decomposition relaxation components, and acquiring a positive electrode calculation charge-discharge curve prepared by calculating an entire image on a basis of the positive electrode partial charge-discharge curve, and a negative electrode calculation charge-discharge curve prepared by calculating an entire image on a basis of the negative electrode partial charge-discharge curve; and a battery state grasping step of calculating a capacity of the lithium ion secondary battery on a basis of the positive electrode calculation charge-discharge curve and the negative electrode calculation charge-discharge curve, and determining or predicting a state of the lithium ion secondary battery.

2. The method for determining a battery state of a lithium ion secondary battery according to claim 1, further comprising a deterioration control step of applying a control unit for suppressing future deterioration to a minimum on a basis of a state of deterioration determined in the battery state grasping step.

3. A method for determining a battery state of a lithium ion secondary battery, the method comprising:

acquiring a positive electrode charge-discharge curve and a negative electrode charge-discharge curve of the lithium ion secondary battery;

partially charging or partially discharging the lithium ion secondary battery;

acquiring, by the partial charge or partial discharge of the lithium ion secondary battery, a partial charge-discharge curve which is a part of a charge-discharge curve of the lithium ion secondary battery when fully charged;

calculating a positive electrode partial charge-discharge curve and a negative electrode partial charge-discharge curve of the lithium ion secondary battery;

interrupting a charging current during charging the lithium ion secondary battery, or interrupting a discharge current during discharging the lithium ion secondary battery;

determining a resistance value of the lithium ion secondary battery on the basis of a relaxation process of a terminal voltage after interrupting the charging current during charging the lithium ion secondary battery or the discharge current during discharging the lithium ion secondary battery;

taking into consideration the resistance value, acquiring a positive electrode calculation charge-discharge curve prepared by calculating an entire image on a basis of the positive electrode partial charge-discharge curve, and acquiring a negative electrode calculation charge-discharge curve prepared by calculating an entire image on a basis of the negative electrode partial charge-discharge curve; and calculating a capacity of the lithium ion secondary battery on the basis of the positive electrode calculation charge-discharge curve and the negative electrode calculation charge-discharge curve.

4. The method of claim 3, further comprising:

changing, by a control unit, a charge-discharge speed or a charge-discharge end voltage on a basis of the capacity of the lithium ion secondary battery.

5. The method of claim 2, further comprising:

changing, by a control unit, a charge-discharge speed or a charge-discharge end voltage on a basis of the capacity of the lithium ion secondary battery.

* * * * *